United States Patent [19]

Wang et al.

[11] Patent Number: 5,723,380
[45] Date of Patent: Mar. 3, 1998

[54] METHOD OF APPROACH TO IMPROVE METAL LITHOGRAPHY AND VIA-PLUG INTEGRATION

[75] Inventors: Chin-Kun Wang, San-chung; Lu-Min Liu, Shin-chu, both of Taiwan

[73] Assignee: Taiwan Semiconductor Manufacturing Company, Ltd., Hsin-chu, Taiwan

[21] Appl. No.: 620,730

[22] Filed: Mar. 25, 1996

[51] Int. Cl.$^6$ .................................. H01L 21/4763
[52] U.S. Cl. .................... 438/624; 438/626; 438/629; 438/639
[58] Field of Search ................. 437/195, 235, 437/238, 241; 438/624, 626, 628, 629, 639

[56] References Cited

U.S. PATENT DOCUMENTS

| | | | |
|---|---|---|---|
| 4,839,311 | 6/1989 | Riley et al. | 437/235 |
| 5,006,485 | 4/1991 | Villalon | 437/235 |
| 5,068,207 | 11/1991 | Manocha et al. | 437/235 |
| 5,077,238 | 12/1991 | Fujii et al. | 437/235 |
| 5,336,640 | 8/1994 | Sato | 437/241 |
| 5,366,850 | 11/1994 | Chen et al. | 437/235 |
| 5,382,545 | 1/1995 | Hong | 437/235 |
| 5,444,019 | 8/1995 | Chen et al. | 437/192 |
| 5,482,900 | 1/1996 | Yang | 437/235 |
| 5,496,771 | 3/1996 | Cronin et al. | 437/235 |

OTHER PUBLICATIONS

S. Wolf et al, "Silicon Processing for the VLSI Era—vol. 2", Lattice Press, Sunset Beach, CA, pp. 65, 236.

Primary Examiner—Charles L. Bowers, Jr.
Assistant Examiner—Lynne A. Gurley
Attorney, Agent, or Firm—George O. Saile; Stephen B. Ackerman

[57] ABSTRACT

A method is described wherein topography of semiconductor wafer surfaces is improved. This is accomplished by introducing a specific planarization technique after the deposition of the first level of metal. It is shown further that the technique involves a combination of oxide and spin-on-glass layers. The resulting dielectric system is etched back in such a way that the resulting two-tiered metal-oxide structure and the surface thereover offers a uniformly flat depth-of-field which in turn makes possible the use of submicron optolithographic tools for the ultra high density integrated circuit chips. In an attempt to improve further the required flatness for submicron technologies, it is shown that silicon nitride may be introduced at a judiciously chosen process step so as to minimize the propagation of surface irregularities from one layer to another through minimizing the so-called microloading effect. It is found that the presence of silicon nitride for this purpose also serves the purposes of eliminating, what are called, the "exploding vias".

20 Claims, 8 Drawing Sheets

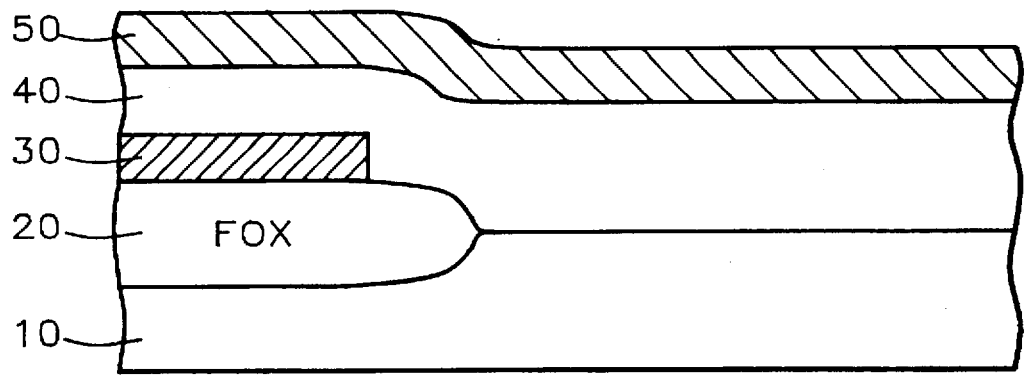
*FIG. 1A – Prior Art*
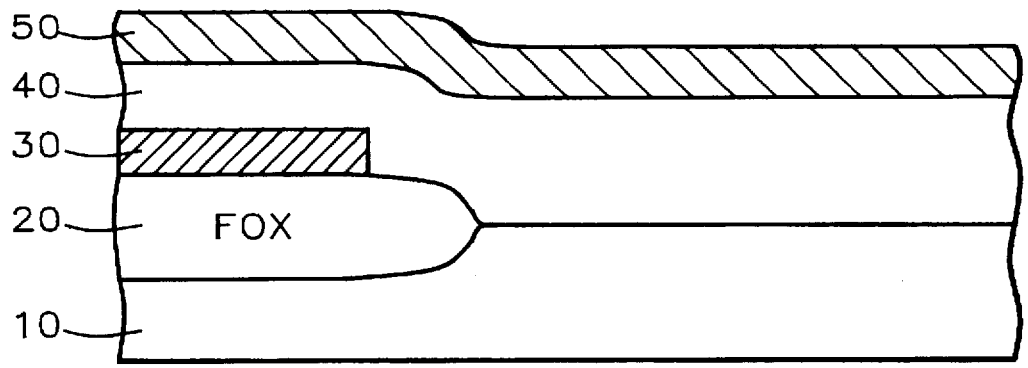
*FIG. 2A – Prior Art*
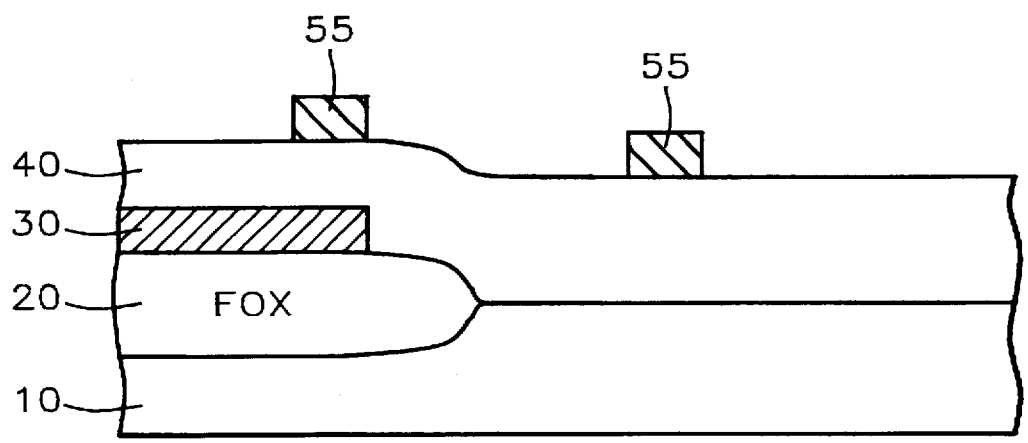
*FIG. 3A – Prior Art*

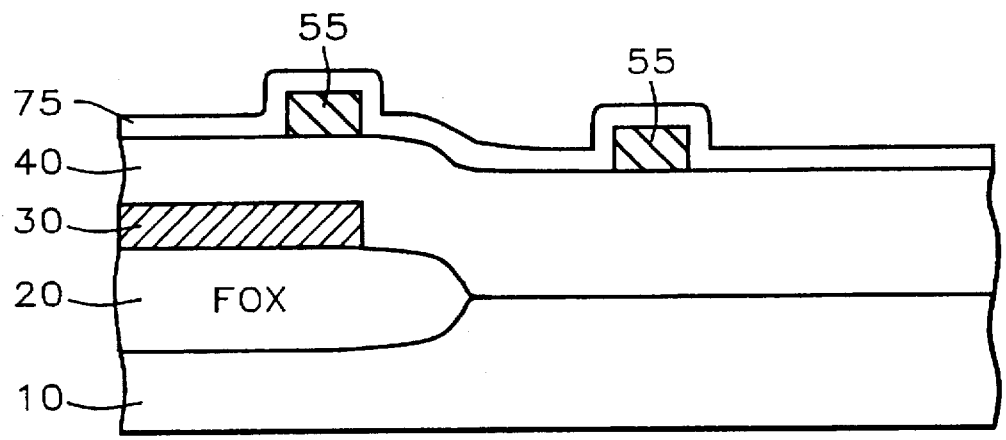
*FIG. 4A – Prior Art*
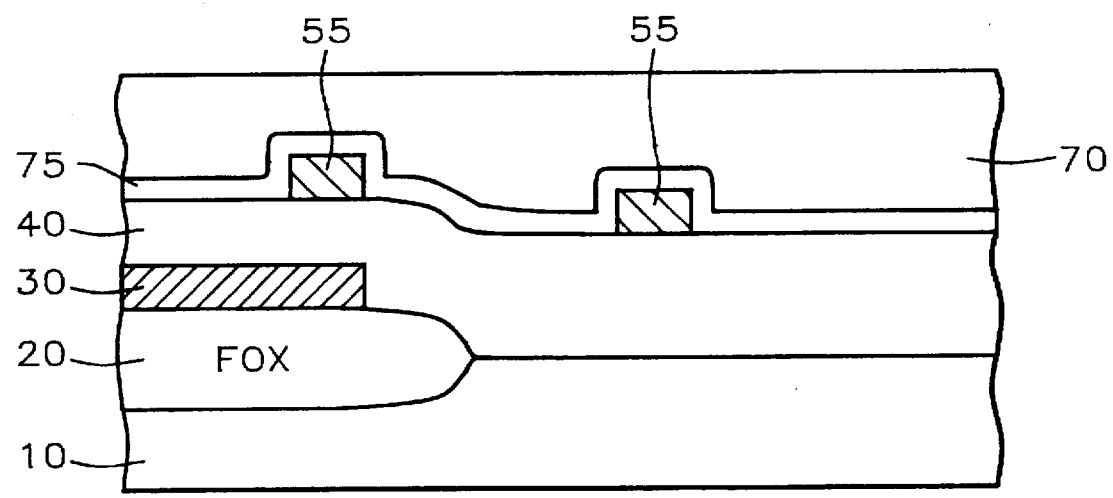
*FIG. 5A – Prior Art*

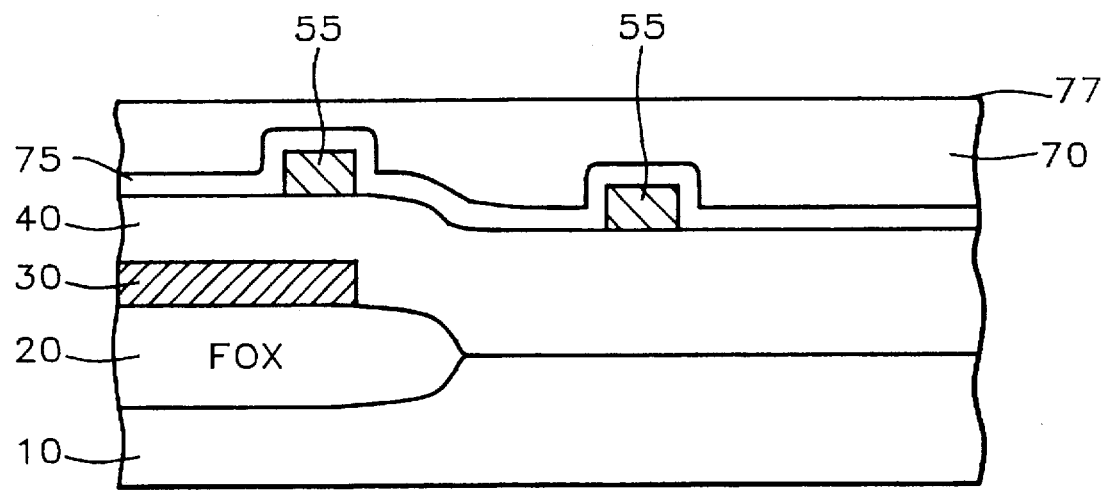
FIG. 6A – Prior Art
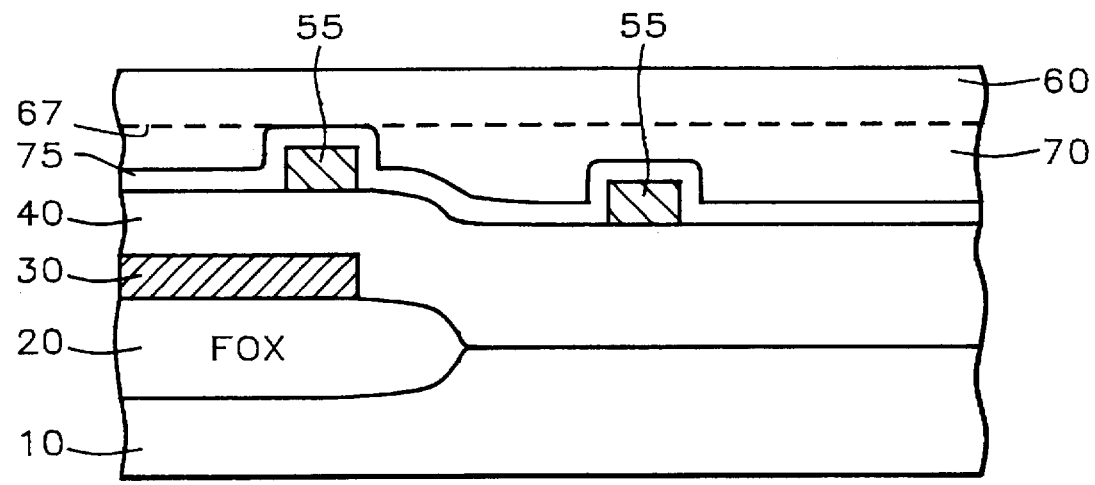
FIG. 7A – Prior Art

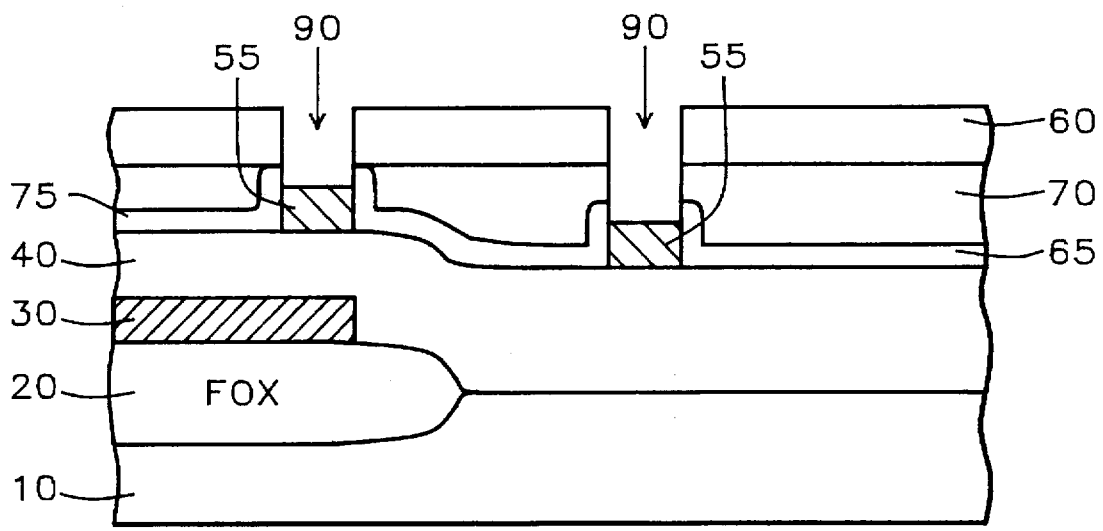
*FIG. 8A - Prior Art*
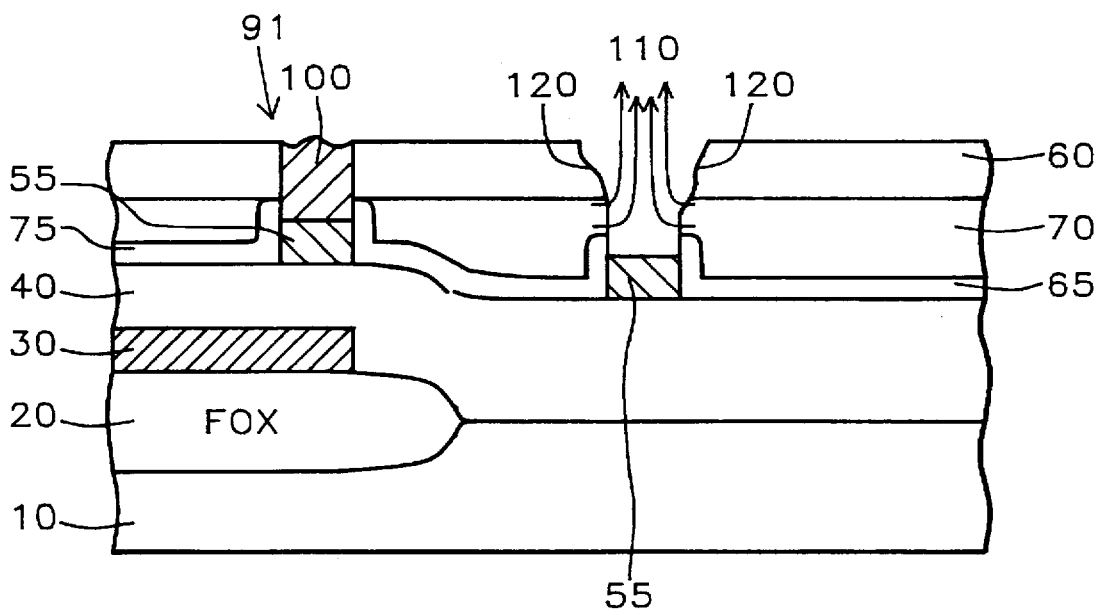
*FIG. 9A - Prior Art*

METHOD OF APPROACH TO IMPROVE METAL LITHOGRAPHY AND VIA-PLUG INTEGRATION

BACKGROUND OF THE INVENTION

(1) Field of the Invention

The invention relates generally to semiconductors, and more specifically to a method of improving metal lithography techniques and via-plug filling. The method employs planarization and etch-back at judiciously chosen process steps prior to interlevel metal depositions. At the same time, the integrity of the via-plugs is improved by depositing thick, high quality oxide in the deep pocket regions. Use of silicon nitride along with the oxide also reduces the microloading effect.

(2) Description of the Related Art

Further advances in submicron integrated circuit technology demand well defined wafer topography and extremely flat surfaces. The depth-of-field limitations of submicron optical-lithography tools require surfaces to be planar within ±0.5 micrometers ($\mu m$) as stated in a chapter on "The Need for Planarity," in the book "SILICON PROCESSING for the VLSI Era," by S. Wolf, et al, published by Lattice Press, Sunset Beach, Calif., p. 65. Thus, if surface conditions are such that the nonplanar irregularities—sometimes in the form of steps—on a wafer layer are larger than 0.5 $\mu m$, then a flattening or planarization of those surfaces is required.

As is well known in the art of semiconductor fabrication in general, integrated circuits are built on a silicon substrate which is polished and very flat initially. Then isolated active-device regions are created within the single-crystal structure, a process which is benign to causing any surface irregularities, per se. All the subsequent processes, however—such as the opening up of holes to contact the devices, interconnecting the devices by means of metal conductors, and the insulation of those conductors from each other both laterally in a layer (intra-layer), or vertically between levels (inter-level)—until the completion of the total integrated circuit chip, all contribute, in some way or another, to different types of surface irregularities. In prior art, the effects—mechanical, electrical or both—of such irregularities on neighboring components could be minimized by simply spacing out the intra-layer components themselves, or by covering them thickly enough so as to diminish their influence between components in different levels of the semiconductor structure. However, with the advent of submicron technology, space is premium, and therefore, other solutions must be found. Furthermore, as devices themselves become smaller, and as they are packed together ever so closely, some of the other second or third order effects that could be hidden in prior art, now have come forward. For example, a flattening or planarizing process of an interlevel insulator effects the integrity of the interstitial metal that connects one level to another. On the other hand, the process of minimizing the irregularities of a metal layer effects the integrity of the surrounding insulating material. Solutions to these cross-effects are discussed in this invention. Most importantly, a submicron methodology for improving lithographic topography in depositing metal layers is presented.

There are examples, in the prior art, where either one or other planarization method is applied to either the metal layers or the interlevel insulators to solve a particular problem relevant to each, respectively. In this invention, the disclosed solution for one resolves a problem in the other, as well, thusly: specifically, a planarization process comprising of specific materials and procedures is introduced prior to the next level of metallization such that the surface onto which the metal is to be deposited later is flat, smooth, i.e., free of nonplanarities. In the absence of such surface irregularities, then, the imaging surface is ready to accept masks with submicron sized features and is able to accommodate the very small depth of focus of the optical steppers used to pattern the circuits on the wafer. Before the metal is deposited to form the intricate circuitry, first the connections from the level below to the next level must be formed by opening holes in the intervening layer of insulator, or the dielectric, and then filled with metal. The holes in the dielectric are called "vias". The proper way of filling these vias, as a function of the metal and dielectrics used, is one of the concerns of the workers in the field. As will be seen in this invention, the particular, and integrated way of surface planarization disclosed here also alleviates one of the serious via filling problems, namely, "exploding vias."

Vias in the dielectric explode when they are exposed to processing temperatures. This is caused by the expansion and release of gasses (outgassing), from the dielectric through the walls of the vias at the time of the metal deposition into the vias. The phenomenon of exploding vias is particularly observed when the dielectric spin-on-glass (SOG) is integrated with the chemical vapor deposition (CVD) of tungsten (W), or CVD-W. According to S. Wolf in his book "Silicon Processing for the VLSI Era" published by Lattice Press, Sunset Beach, Calif., p 236, the source of the gasses has been found to be primarily moisture that remains within the SOG due to insufficient curing or that has been reabsorbed during the wet process steps performed following spin-on and curing of the SOG film (e.g., during resist removal after the via etch or during pre-metal-deposition cleaning steps.) An additional source for these detrimental gasses is the chemical reduction of tungsten hexafluoride ($WF_6$) by silicon, hydrogen or silane which yield vapors of the type silicon fluoride ($SiF_4$), hydrogen fluoride (HF), and $SiF_4$, respectively. The silane reduction process is preferred. However, when used alone, both the CVD-W process and the use of SOG compare favorably with other approaches. SOG has good shelf life, a simple cure cycle, excellent thermal stability, low stress and good crack resistance, spin-on uniformity, good adhesion and an appropriate film-thickens range. CVD-W exhibits excellent resistance to electromigration effects, hillock formation, and humidity induced corrosion, and other characteristics which readily lend themselves to very high circuit packing densities. Hence, when combined, an integrated SOG/CVD-W process would result in added advantages. The following is a comparative description of prior art and the disclosed method where the latter, by a judiciously chosen process step, integrates SOG with CVD-W resulting in improved metal lithography techniques and via-plug filling.

The alphanumerically designated FIGS. 1(A)–9(A) and 1(A)–9(B) show, respectively, a series of steps involved in depositing various layers on a semiconductor substrate by utilizing prior art and the method of this invention. Altogether, nine figures are shown, and it will be evident in the ensuing discussion that the number of the figures also correspond to the step number of the process depicted in that particular figure, while the alpha-suffix (A) refers to prior art, and (B) to the present invention.

To begin, a silicon wafer is provided up to the first level of metal. That is, the various components such as the drain-gate-source have been implanted, isolated, and covered with a dielectric material prior to metallization. In both cases, the first level dielectric is a boron and phosphorous doped BP-ETOS film. Undoped films are deposited by the decomposition of tetraethyl orthosilicate (TEOS). The first metal, which is aluminum copper, AlCu, as shown in the figures, is then deposited by well-known techniques which are not described in detail here in order not to unnecessarily obscure the present invention.

In FIGS. 1(A) and 1(B), the deposition of the first metal is designated as the first step of a series of nine process steps thereafter. All of the steps are applicable to both the prior art and the present invention; with one exception, however; Step 2 of FIG. 2(A), which is introduced in this invention is lacking in the prior art, as seen in comparing FIG. 2(A) with FIG. 2(B). This Step 2 consists of a planarization process judiciously introduced at this juncture so as to shape in the flatness of the substrate at early stages of the semiconductor structure. It will be appreciated that this step could in fact be introduced still earlier at the time of the poly-metal deposition in forming the local interconnects for the source-gate-drain regions. Nevertheless, the positive effects of planarization even at this stage is clearly demonstrated after the next step of metal photo/etch as seen in FIG. 3(B). In the absence of Step 2, and, therefore, at Step 3, the tops of the etched metal in the prior art, FIG. 3(A), are formed at different depths because of the unevenness of the blanket metal in the first place. This then creates different depths of foci for the next level of metal, which is a problem for the optical exposure tools. The net result is then a reduced resolution capability for the optical system which in turn presents a major limiting factor in the processing of submicron feature sized integrated circuits. In the present invention, prior to photo metal/etch in Step 3 of FIG. 3(B), a judicious planarizing is performed to avoid the problem of unevenness and hence optical aberrations in the photolithographic process.

To be able to appreciate the benefits of Step 2, it is well to review briefly the elements of Step 3, namely, that of the photo-metal-etch step in FIG. 3. The patterns that define the circuits on each metal layer in a semiconductor structure are created by lithographic process. That is, layers of photoresist materials are first spin-coated onto the surface to be patterned. Next, the resist layer is selectively exposed through a mask (or recticle in step-and-repeat projection systems) to a form of radiation, such as ultraviolet light, electrons, or x-rays. The mask contains clear and opaque features that define the pattern to be created in the photoresist layer. The patterns in the resist are formed when the photoresist undergoes the subsequent "development" step. The areas of resist remaining after development protect the substrate regions which they cover. Locations from which resist has been removed is then subjected to subtractive etching process in this case, (or additive, in other cases) that transfer the pattern onto the underlying surface.

For the precise transfer of the circuit patterns onto the underlying metal surface to occur, first the transfer of patterns from the mask to the photoresist must be of high resolution. This requires that the depth of focus over an imaging surface be uniform. Though the spin-coated photoresist provides a relatively flat imaging surface for that purpose, it still does not provide the flatness that is now required for resolving submicron-sized features. That is provided with the planarization process of Step 2 in FIG. 2(B) that is disclosed in this invention. Furthermore, it will be observed that when the pattern is finally etched into the metal, the tops of the patterned metal will be formed at elevations where the metal thickness has reached. In the subsequent semiconductor processes, this unevenness in elevation will propagate upwards to upper layers, exacerbating the problem of optical resolution mentioned above. In Step 2 of FIG. 2(B) of this invention, the tops of the metal will be "built-up" and planarized so as to provide the desired flatness for the microlithography that is required in today's submicron technology.

In the critical Step 2 of FIG. 2(B), an initial layer of PECVD-oxide is first deposited using conventional plasma-enhanced chemical vapor deposition techniques. This is to provide an intervening layer between the next spin-on-glass (SOG) layer and the metal, because frequent adhesion failures are observed when SOG is in contact with metal. After being spun on, the liquid SOG is baked to drive off the solvent, and any water that evolves from the film due to the polymerization process. The next process in this planarization step is to etch-back the SOG such that no SOG remains over locations at which vias will be etched. At this point, the surface is micro-planarized, and is ready to accept the appropriate mask for the micro-lithographic process that was described for Step 3 above. After Step 3, a dual layer structure is obtained as shown in FIG. 3(B). Comparing the structures of the prior art with that of the present invention after Step 3, it is now clear that the tops of the latter structure are at the same level. This provides the basis for building up further levels of metallization which are flat, planar and suitable for submicron photolithographic processes. It will be obvious to those skilled in the art, the same planarization described in Step 2 of FIG. 2(B) can be applied at any level of metallization in the processing of semiconductor wafers.

In Steps 4 through 9 (FIGS. 4-9), the integrity of the interconnecting vias is sought. In prior art as shown in FIG. 4(A), PECVD-oxide (75) is deposited over the patterned first level metal, a Step 4. Then, immediately, in Step 5 of FIG. 5(A), SOG (70) is spun over and cured in the conventional way. In Step 6 of FIG. 6(A), the SOG may be partially etched back (77) so that it remains only in the troughs between the metal lines, or not etched back (77) at all so that SOG remains permanently as a continuos thin film between two layers of PECVD-oxide. The next layer of PECVD-oxide (60) is deposited in Step 7 of FIG. 7(A), and serves as the interlevel dielectric between two metal layers. Step 8 of FIG. 8(A) is a repeat of Step 3 where mask/photo/etch processes are carried out. The holes so formed in Step 8 are then filled with tungsten to form via-plug interconnections between the first metal layer and the next which is deposited over the plugs as the last process in Step 9 of FIG. 9(A). It is in Step 8 that the vias explode, which this invention teaches how to prevent by judiciously introducing still another process in Step 4.

In Step 4 of FIG. 4(B), the present invention proposes to coat the two-tiered (metal and PECVD-oxide) or dual layer of Step 3 with a thin layer of silicon nitride (SIN). The rest of the Steps 5 through 9 in FIGS. 5 thorugh 9 are the same as described for the prior art above. However, the addition of the SiN layer in Step 4 helps to solve the problem of exploding vias in the following way:

In Step 5 of FIG. 5(B), during baking and plasma ashing of the SOG film, water is evolved from the film due to polymerization of the silanol [SiOH] groups as seen in the reaction

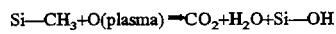

$$Si-CH_3 + O(plasma) \rightarrow CO_2 + H_2O + Si-OH$$

The loss of considerable mass together with material shrinkage creates a tensile stress in the film although the addition of the organic methyl group $CH_3$ somewhat resists the concomitant cracking. Should these cracks be unchecked, further outgassing will result from the SOG during Step 6 when CVD-W (tungsten) is deposited in the holes. In the prior art, two detrimental effects are observed. In the silane reduction of the tungsten hexafluoride ($WF_6$), namely,

$$2WF_6(vapor)+3SiH_4(vapor) \Rightarrow 2W(solid)+3SiF_4(vapor)+6H_2(vapor)$$

the outgassing from the SOG lessens the diffusion of $WF_6$, thereby causing uneven tungsten coverage in the sidewalls of the hole. The second major problem is the "exploding vias" caused by the expansion and release of passes in the SOG. In the present invention, both of these problems are avoided by passivating the SOG in the sidewalls by depositing SiN in Step 4 of FIG. 4(B) before Step 5 of FIG. 5(B).

An additional advantage of SiN is that its presence in Step 6 of FIG. 6(B) during SOG etch-back reduces microloading. Briefly, when the etch rate is dependent upon the amount of etchable surface exposed to the etchant, the phenomenon is called a "loading effect." When the etch rate is also sensitive to the pattern density on the wafer surface, as is observed in etching spin-on-glass, it is known as the "micro-loading effect." Loading effects are global and are most commonly encountered in dry-etch processed where they can occur in variety of different conditions. For example, the etch rate can be dependent upon the number of wafers present in an etching chamber. Microloading, on the other hand, is local in the sense that it is affected by the continuously changing etchable area even during the etching process itself. In this invention, the presence of silicon nitride under the SOG layer helps reduce microloading. This is because when the nitride film is etched during the SOG etchback, there is no oxygen released to enhance the etch rate of the SOG film. Consequently, silicon nitride under the SOG layer helps to reduce the microloading effect.

Hence an integrated process is disclosed where the desirable properties of SOG (good planarization) and CVD-W (good deposition) are utilized to yield improved metal lithography and via-plug integrity while the undesirable properties such as outgassing from the SOG are kept under control by judicious choice of process Steps.

SUMMARY OF THE INVENTION

It is therefore an object of this invention to improve the topography of semiconductor wafer surfaces so as to enhance the process window for submicron metal lithography It is a further object of this invention to improve the via filling process in semiconductor manufacturing so as to avoid exploding vias.

It is still another object of the invention to reduce variable etching rates and the concomitant microloading effects in order to improve etching of patterned layers of different shapes and areas.

In accordance with the present invention, a method is described for introducing a specific planarization technique after the deposition of the first level of metal on a wafer. The same technique can then be repeated on as many other layers as are necessary for the multilevel metallurgy of submicron integrated circuit devices. The method begins by depositing an oxide layer on top of the first metal layer. Liquid glass is spun on this layer next, to achieve planarization and then etched back completely into the oxide layer below but not as far down as the metal layer. This completes the planarization Step. The surface now is very flat and free of any irregularities that would adversely affect the resolution of the photolithographic process used for patterning the metal layer below. After the photoexposure through a mask, a two-step etch is used to first etch the interlevel oxide and then the metal. The cross-section of the resulting pattern is a two-tiered structure comprised of metal and a layer of oxide. The layer of oxide serves as a surface leveler in that the tops of the patterned composite layer are all at the same elevation (elevation used here in the ordinary sense of vertical direction). It will be appreciated that the structure so formed provides the foundation for the flatness of the next level of the multilayer construction.

The next objective of the present invention is accomplished by coating the two-tiered patterned structure with silicon nitride, SiN, prior to spinning glass on to form the interlevel dielectric between the first metal layer and the second. As is well known, the free surfaces of the spin-on-glass (SOG) release gasses when subjected to semiconductor processing temperatures. In the methodology disclosed here, the sidewalls of the vias that are etched into the interlevel dielectric are not exposed to SOG because of the intervening SiN coating. In this manner, when tungsten is silanated into these holes, there is no outgassing, and hence no "exploding vias."

The method of applying silicon nitride over the two-tiered composite metal-oxide pattern serves to accomplish the other objective of the invention as well, namely, to reduce the "micro-loading" effect. In this manner, when etching back the spin-on-glass, the pattern density does not become a factor.

BRIEF DESCRIPTION OF THE DRAWINGS

The alphanumerically designated FIGS. 1(A)–9(A) and FIGS. 1(B)–9(B) show a series of steps involved in depositing various layers in prior art, and in the present invention, respectively.

FIG. 1(A) is a cross-sectional drawing of the prior art showing a semiconductor substrate up to and including the first level of metal.

FIG. 1(B) is a cross-sectional drawing of the prior art substrate used in the beginning Step 1 of the present invention.

FIG. 2(A) is a cross-sectional drawing of the prior art showing no planarization step.

FIG. 3(A) is a cross-sectional drawing of the prior art substrate after the metal photo/etch process.

FIG. 4(A) is a cross-sectional drawing of the prior art substrate after the PECVD-oxide deposition process.

FIG. 5(A) is a cross-sectional drawing of the prior art substrate after the silicon-on-glass coating and curing process.

FIG. 6(A) is a cross-sectional drawing of the prior art substrate after the non- or partial etch-back process.

FIG. 7(A) is a cross-sectional drawing of the prior art substrate after the PECVD-oxide deposition process.

FIG. 8(A) is a cross-sectional drawing of the prior art substrate after the via photo/etch process.

FIG. 9(A) is a cross-sectional drawing of the prior art substrate showing exploding vias due to outgassing during the second level metallization process.

FIG. 9(B) is a cross-sectional drawing of a substrate showing no exploding vias during the second level metallization process in Step 9 of the present invention.

DESCRIPTION OF THE PREFERRED EMBODIMENTS

Figure 1B:
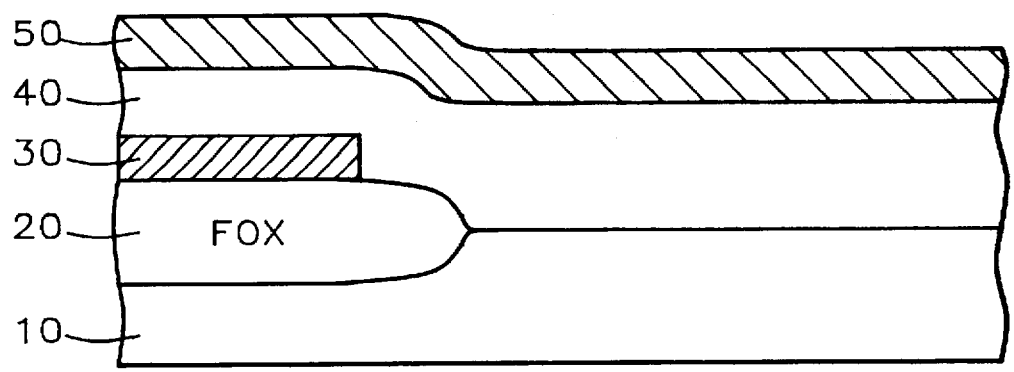
Figure 2B:
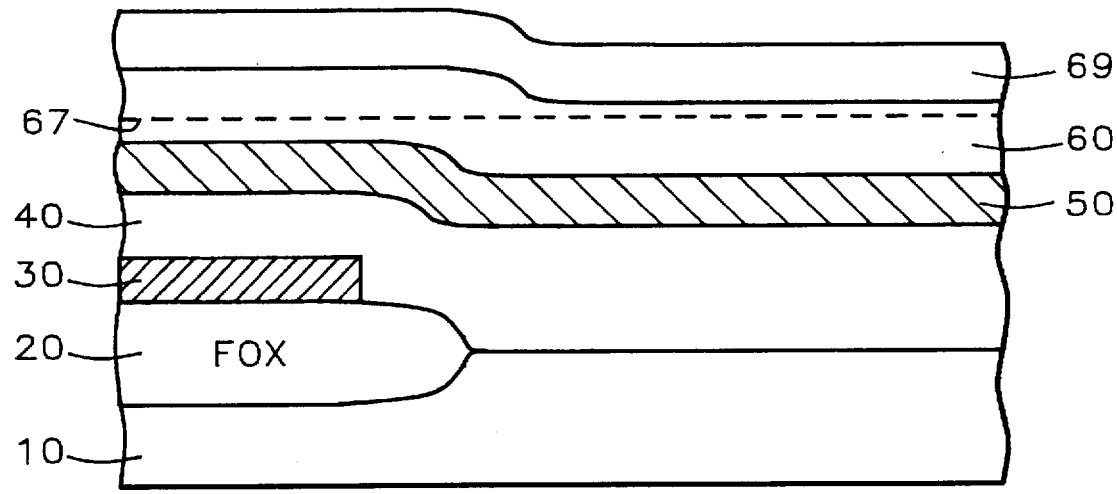
FIG. 2(B) is a cross-sectional drawing of a substrate prepared for planarization in Step 2 of the present invention.

Referring now to the FIGS. 1–9, the preferred embodiments are shown in Figures with the suffix (B) starting with Step 2 of FIG. 2(B). In Step 1 of FIG. 1, the first metal layer (region 50) is deposited by the well-known techniques which are not described here in order not to unnecessarily obscure the present invention. Nor the wafer, comprising of regions 10, 20, 30, 40, is described for the same reasons. The referenced regions are, respectively, the substrate, field oxide, poly-metal, and a first level dielectric, such as BP-TEOS described in the related art above. It will be obvious to those skilled in the art that although the references are to a MOS structure in particular, the embodiments described here are equally applicable to bipolars as well.

In Step 2 of FIG. 2(B), a PECVD-oxide (60) of thickness of between about 0.8 and 1.2 micrometers is deposited over the first metal layer (50). This is a high quality oxide like silicon dioxide and will later serve as the basis for leveling the elevation of the patterned metal throughout the surface plane of the wafer. The next layer (69) is the spin-on-glass (SOG) with a thickness of between about 0.6 and 0.8 micrometers. Its function is to provide the desired planarization.

The materials used for the SOG and how they are processed are critical to the success of the process. The most useful materials are silicates—$Si(OH)_4$ and siloxanes—$(RO)_nSi(OH)_{4-n}$. The material to be applied is thoroughly mixed in a suitable solvent which is usually a combination of a high boiling point solvent and a low boiling point solvent. The SOG material suspended in the vehicle or solvent is deposited on the semiconductor wafer surface and uniformly spread thereover by the action of spinning the wafer. Most of the vehicle or solvent is driven off by a low temperature baking step. At this point, the critical vacuum degassing step is accomplished by subjecting the wafer to a vacuum of less than about 100 mtorr and 350 degrees C. This last step is meant to remove chemical materials which could during latter processing cause outgassing and hence exploding vias. It is found that the avoidance of exploding vias is assured only through a built-in barrier to those chemical substances and gasses. Such a barrier (85) is applied in Step 4 of FIG. 4(B).

Figure 3B:
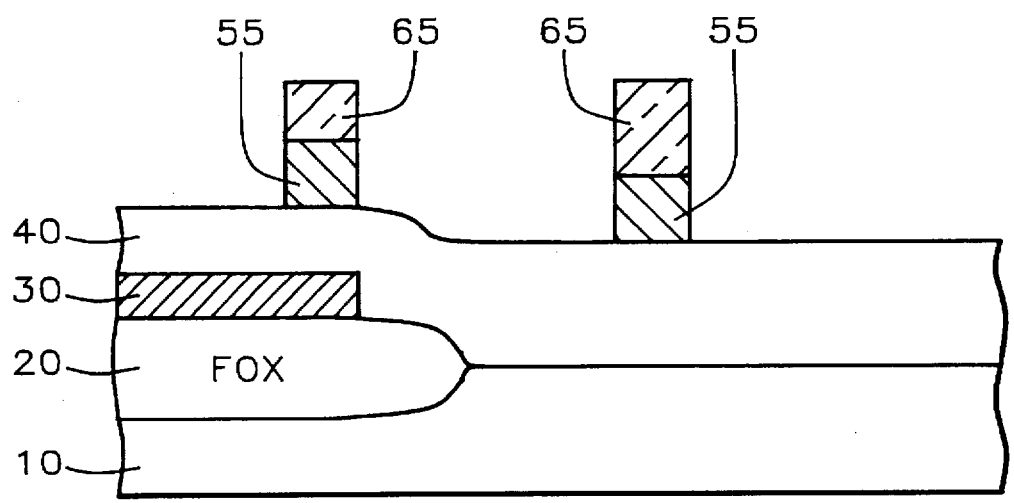
FIG. 3(B) is a cross-sectional drawing of a substrate after the metal photo/etch process in Step 3 of the present invention.

In Step 3 of FIG. 3 (B), the SOG is etched back completely and well into the PECVD-oxide region (67). A photoresist is applied as a thin film over this flat etched surface, and subsequently exposed through a mask. Using the conventional photo/etch techniques, which are not described here for brevity, the metal layer is patterned as shown in Step 3 of FIG. 3b. The resulting structure is two-tiered, with PECVD-oxide (65) residing on top of the metal layer (55). Region 65 may be thought of as a vertical spacer over the metal to provide a temporary foundation for the flatness of the next level of the multilayer construction. It will be noted that such a construction device is totally lacking in the prior art.

Figure 4B:
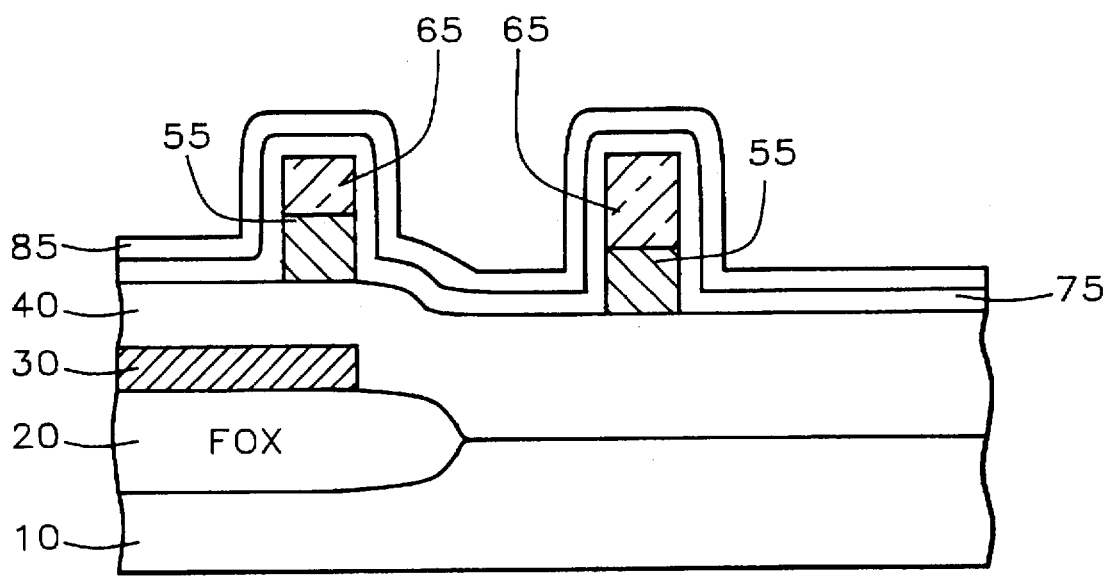
FIG. 4(B) is a cross-sectional drawing of a substrate after the of PECVD-oxide and silicon-nitride deposition process in Step 4 of the present invention.

The two-tiered layer is coated with a PECVD-oxide (75) in Step 4 of FIG. 4(B). This is followed by the important step of applying still another coating; this time silicon nitride, SiN (region 85). Because silicon nitride behaves as a nearly impervious barrier to diffusion—in particular to gaseous products—region 85 in Step 4 of FIG. 4(B) will serve to prevent outgassing into the vias when depositing tungsten (regions 100) in Step 9 of FIG. 9(B).

Figure 5B:
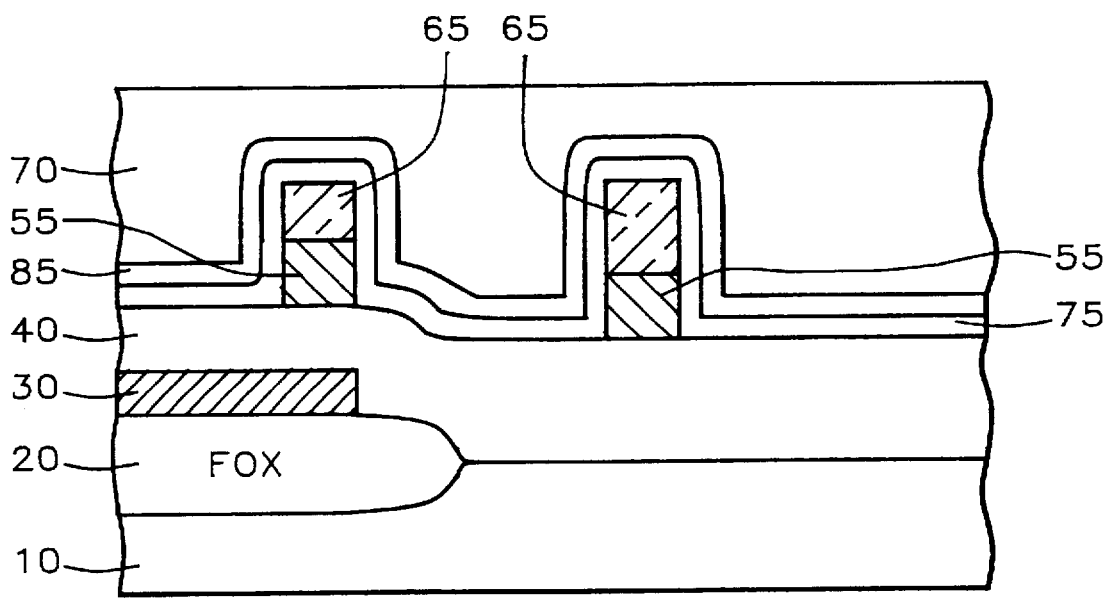
FIG. 5(B) is a cross-sectional drawing of a substrate after the silicon-on-glass coating and curing process in Step 5 of the present invention.
Figure 6B:
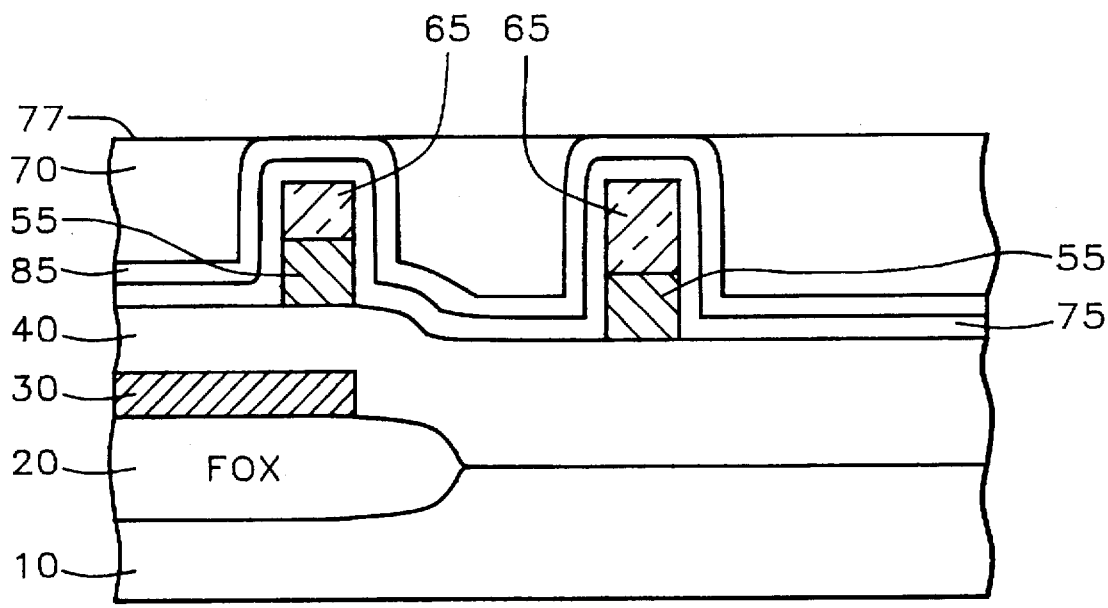
FIG. 6(B) is a cross-sectional drawing of a substrate after the complete etch-back process in Step 6 of the present invention.
Figure 7B:
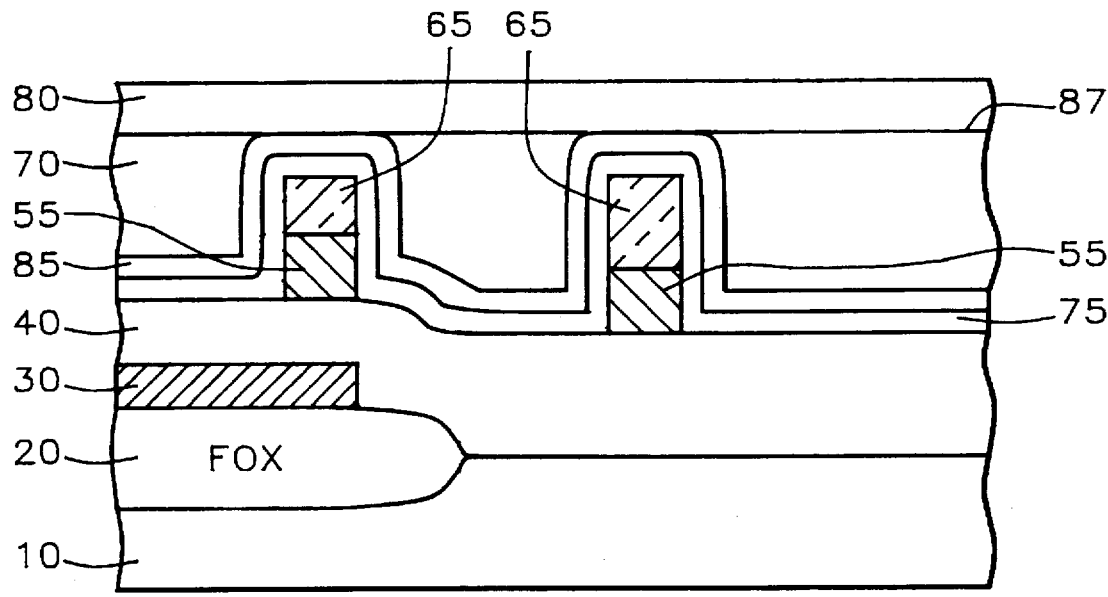
FIG. 7(B) is a cross-sectional drawing of a substrate after the PECVD-oxide deposition process in Step 7 of the present invention.

Steps 5, 6 and 7 of FIGS. 5(B), 6(B) and 7(B), respectively, involve a second SOG coating and curing (70), the etch-back of SOG (77), the deposition of PECVD-oxide (80), and two-step etch-back (87), respectively, similar to the planarization process described in Step 2 of this invention. Here again, the process, in the order given, assures the flatness required to achieve a relatively uniform depth of field over the surface, (87). In Step 8 of FIG. 8(B), photolithographic processes are used to apply, expose and develop the photoresist containing the various patterns. The etching through the open patterns in the photoresist into the interlevel dielectrics is accomplished in such a way that, first the PE-oxide layer (80) is removed. Next, the temporary vertical spacer 65, that is, the top tier of the two-tiered structure is removed until the underlying tier, namely, metal (55) is reached.

Figure 8B:
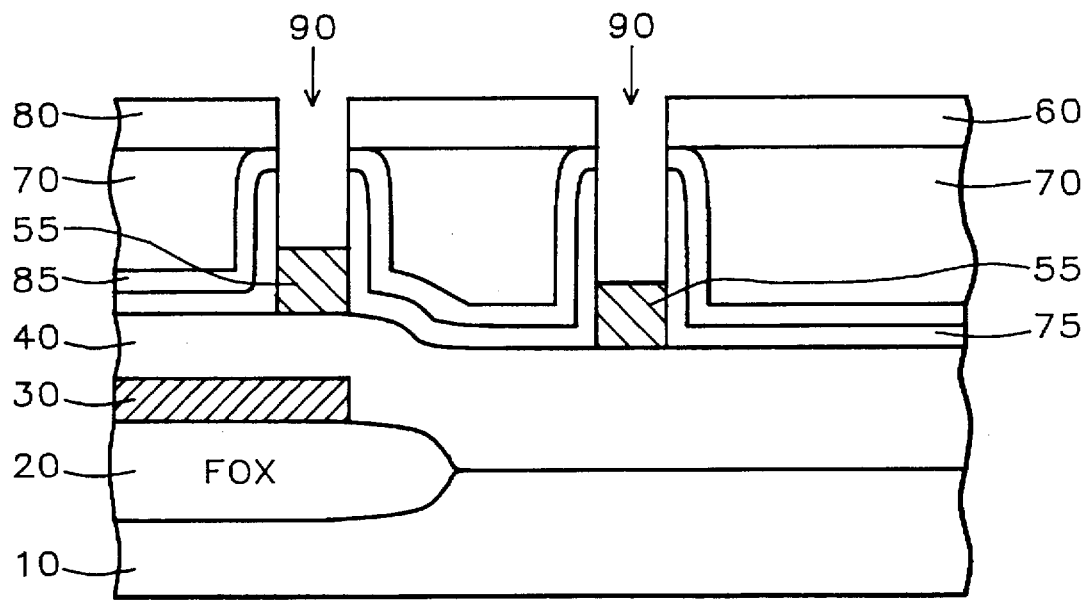
FIG. 8(B) is a cross-sectional drawing of a substrate after the via photo/etch process in Step 8 of the present invention.

Referring now more particularly to the vias (90) in Step 8 of FIGS. 8(A) and 8(B), and comparing them with each other, it will be observed that the etched holes are markedly different from one another. In FIG. 8(B) of the present invention the sidewalls of the via holes are completely sealed from the surrounding interlevel dielectric, SOG (70). This is good, because the sealant is silicon nitride, and is impervious to SOG outgassing. On the contrary, in FIG. 8(A) of the prior art, the via holes there, are exposed, at least partially, to the surrounding SOG. This is because, unlike the via construction disclosed in this invention, the prior art does not utilize nitride passivation (85) in the via holes. As a result, when tungsten (100) is deposited into the holes as shown in Step 9, FIG. 9(A), the SOG at the sidewalls becomes exposed to the process environment and the outgassing (110) therefrom causes vias to explode. Though most vias in the prior art experience this craterous damage (120), some very shallow holes may escape it to some extent if the oxide film itself is tall enough to cover the sidewalls. Hence tungsten may be deposited into such a hole (91) without the craterous damage. It should be noted that oxide thickness is usually kept low to keep the internal stresses of the film low. Therefore, most of the holes and especially those that are deep will experience the via explosion for the reasons given. It will be appreciated that in the present invention, the method disclosed does not allow SOG to be exposed on the sidewalls of any of the vias. A closer examination of FIG. 9(B) in Step 9 will reveal that the part of the sidewall that the oxide does not reach, is now covered by the silicon nitride. Hence, no explosion of the vias occur when tungsten (100) is deposited into the holes followed by second level metallization (130) as shown in the same FIG. 9(B).

Figure 9B:
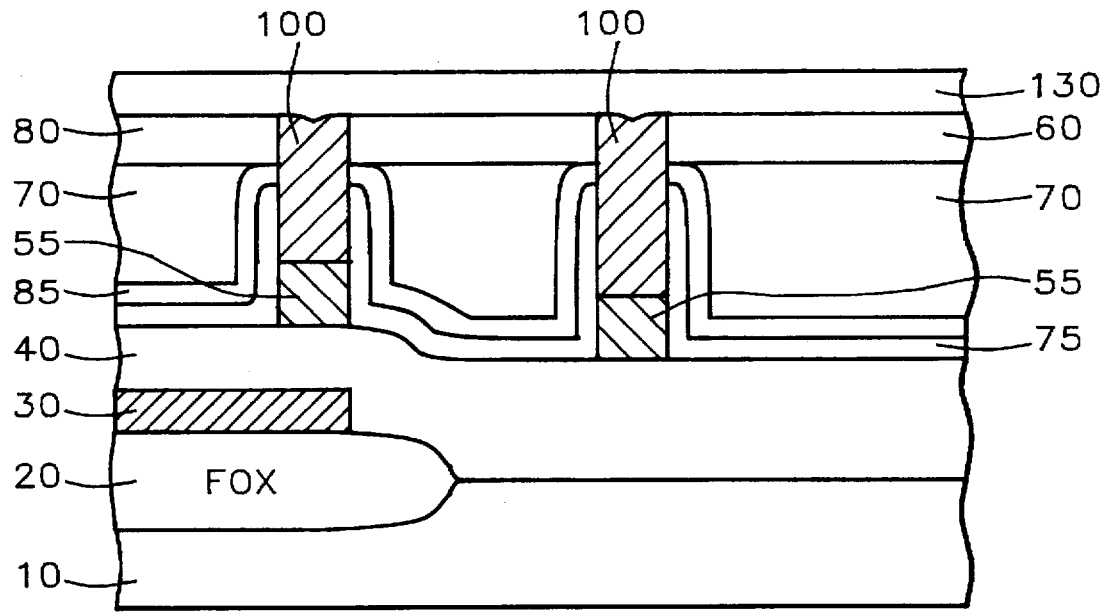

Prior to the advantageous utilization of silicon nitride in Step 9 of FIG. 9(B), its judicious application at Step 4 of FIG. 4(B) also provides another advantageous utilization in the via photo/etch process of Step 8 of FIG. 8(B). There, when etching back the spin-on-glass, the presence of silicon nitride also reduces the microloading effect whereby the pattern density does not become a substantial factor.

While the invention has been particularly shown and described with reference to the preferred embodiments thereof, it will be understood by those skilled in the art that various changes in form and details may be made without departing from the spirit and scope of the invention. For instance, the same procedures described here for MOS fabrication are just as applicable to the fabrication of bipolar semiconductors.

What is claimed is:

1. A method for improving the lithographic topography of wafer surfaces, and for improving metal deposition and via filling in multilayer metallurgy of submicron IC devices comprising the steps of:

provicing a semiconductor substrate having MOS devices formed within and on its surface and with at least one blanket metal layer thereover;

depositing a first oxide coating over said blanket metal layer;

covering said first oxide coating with a first spin-on-glass layer;

performing etch-back of said first spin-on-glass layer;

performing partial etch-back of said first oxide coating;

applying a photo-resist on to the partially etched back first oxide coating surface and patterning said first oxide coating surface to form a mask;

etching the remaining first oxide coating exposed through the mask to form said patterning in said oxide coating and in the underlying said blanket metal layer;

depositing a second oxide coating over said patterning in said underlying blanket metal layer;

covering said second oxide coating with a coating of silicon nitride;

depositing a second spin-on-glass on said coating of silicon nitride;

performing etch-back of said second spin-on-glass layer;

depositing a third oxide coating over said etched back second spin-on-glass layer;

etching via holes reaching the patterned metal layer;

depositing tungsten metal into said via holes; and depositing second level metal on said semiconductor substrate.

2. The method of claim 1 wherein said depositing a first oxide coating is accomplished in a PECVD reactor by decomposing tetraethosiloxane also known as TEOS, at a temperature between about 350° to 375° C.

3. The method of claim 1 wherein said first oxide coating has a thickness between about 0.8 and 1.2 micrometers.

4. The method of claim 1 wherein said first spin-on-glass having a thickness between about 0.6 and 0.8 micrometers is deposited and then baked at a temperature between about 150°–250° C. and then cured at a higher temperature between about 400° to 425° C.

5. The method of claim 1 wherein plasma-$O_2$ ashing is used to etch-back said first spin-on-glass.

6. The method of claim 1 wherein said partial etch-back of said first oxide coating is accomplished by stopping said partial etch-back at a depth to accommodate the highest elevation in the underlying metal layer.

7. The method of claim 1 wherein said mask is used to form a two-tiered structure.

8. The method of claim 1 wherein said two-tiered structure comprises a top portion and lower portion.

9. The method of claim 8 wherein said top portion comprises said first oxide coating and lower portion comprises said blanket metal layer.

10. The method of claim 7, wherein said second oxide coating is deposited over said two-tiered structure and is accomplished in a PECVD reactor by decomposing TEOS, at a temperature between about 350° to 375° C. and up to a thickness of about 1.0 micrometer.

11. The method of claim 1 wherein said coating of silicon nitride has a thickness less than about 1.0 micrometer.

12. The method of claim 1 wherein said second spin-on-glass having a thickness between about 0.6 and 0.8 micrometers is deposited and then baked at a temperature between about 150° to 250° C. and then cured at a higher temperature between about 400° to 425° C.

13. The method of claim 1 wherein plasma-$O_2$ ashing is used to etch-back said first spin-on-glass.

14. The method of claim 13 wherein a microloading effect is reduced by depositing said coating of silicon nitride by PECVD where silane and nitrogen are reacted in a plasma at a temperature between about 200° to 400° C.

15. The method of claim 1 wherein said depositing said third oxide coating is accomplished in a PECVD reactor by decomposing TEOS, at a temperature between about 350° to 375° C.

16. The method of claim 15 wherein said third oxide coating has a thickness between about 0.8 to 1.2 micrometers.

17. The method of claim 1 wherein said via holes are selectively etched until the patterned metal layer is reached.

18. The method of claim 1 wherein said depositing tungsten metal into said via holes is accomplished with a silane reduction process.

19. The method of claim 18 wherein said silane reduction process is accomplished with tungsten hexafluoride at a temperature less than about 350° C.

20. The method of claim 1 wherein said second level metal is aluminum-copper.

* * * * *